(12) United States Patent
Sueda et al.

(10) Patent No.: US 10,836,647 B2
(45) Date of Patent: *Nov. 17, 2020

(54) LOW ALPHA DOSE BARIUM SULFATE PARTICLE, AND USE AND PROCESS FOR PRODUCING THE SAME

(71) Applicant: SAKAI CHEMICAL INDUSTRY CO., LTD., Osaka (JP)

(72) Inventors: Satoru Sueda, Fukushima (JP); Hironobu Ogata, Fukushima (JP)

(73) Assignee: SAKAI CHEMICAL INDUSTRY CO., LTD., Osaka (JP)

( * ) Notice: Subject to any disclaimer, the term of this patent is extended or adjusted under 35 U.S.C. 154(b) by 302 days.

This patent is subject to a terminal disclaimer.

(21) Appl. No.: 16/063,762

(22) PCT Filed: Dec. 23, 2016

(86) PCT No.: PCT/JP2016/088593
§ 371 (c)(1),
(2) Date: Jun. 19, 2018

(87) PCT Pub. No.: WO2017/111146
PCT Pub. Date: Jun. 29, 2017

(65) Prior Publication Data
US 2020/0270139 A1    Aug. 27, 2020

(30) Foreign Application Priority Data

Dec. 25, 2015  (JP) .................. 2015-255451

(51) Int. Cl.
| | |
|---|---|
| *C01F 11/46* | (2006.01) |
| *C08K 3/30* | (2006.01) |
| *C08K 9/02* | (2006.01) |
| *C09C 1/02* | (2006.01) |
| *G03F 7/004* | (2006.01) |

(52) U.S. Cl.
CPC ............ *C01F 11/462* (2013.01); *C08K 3/30* (2013.01); *C08K 9/02* (2013.01); *C09C 1/027* (2013.01); *G03F 7/0043* (2013.01); *C01P 2004/80* (2013.01); *C01P 2006/12* (2013.01); *C01P 2006/80* (2013.01); *C08K 2003/3045* (2013.01); *C08K 2201/006* (2013.01)

(58) Field of Classification Search
CPC ........... C01F 11/462; C08K 3/30; C08K 9/02; C08K 2003/3045; C08K 2201/006; C09C 1/027; G03F 7/0043; C01P 2004/80; C01P 2006/12; C01P 2006/80
USPC ........................................................ 524/423
See application file for complete search history.

(56) References Cited

U.S. PATENT DOCUMENTS

| | | | |
|---|---|---|---|
| 6,274,662 B1 | 8/2001 | Lynch | |
| 2008/0226522 A1 | 9/2008 | McKee | |
| 2013/0028786 A1* | 1/2013 | Kanou | .................. B23K 35/40 420/558 |
| 2015/0111992 A1* | 4/2015 | Shimizu | .................. C08K 9/02 523/453 |

FOREIGN PATENT DOCUMENTS

| | | |
|---|---|---|
| JP | 53-060893 | 5/1978 |
| JP | 11-035319 | 2/1999 |
| JP | 11-92139 | 4/1999 |
| JP | 2002-541051 | 12/2002 |
| JP | 2008-50261 | 3/2008 |
| JP | 2009-519882 | 5/2009 |
| JP | 2012-513365 | 6/2012 |
| WO | 2014/007325 | 1/2014 |

OTHER PUBLICATIONS

International Search Report dated Feb. 7, 2017 in International Application No. PCT/JP2016/088593.

* cited by examiner

*Primary Examiner* — Hui H Chin
(74) *Attorney, Agent, or Firm* — Wenderoth, Lind & Ponack, L.L.P.

(57) ABSTRACT

The invention provides a low alpha dose barium sulfate particle having a silica content of 0.6% by weight or less and an alpha dose of 0.07 cph/cm$^2$ or less.

9 Claims, No Drawings

LOW ALPHA DOSE BARIUM SULFATE PARTICLE, AND USE AND PROCESS FOR PRODUCING THE SAME

TECHNICAL FIELD

The present invention relates to a low alpha dose barium sulfate particle, and use and a process for producing the same. More specifically, the invention relates to a low alpha dose barium sulfate particle having a silica content of 0.6% by weight or less and an alpha dose of 0.07 cph/cm$^2$ or less and a process for producing the same. The invention further relates to use of such a low alpha dose barium sulfate particle.

BACKGROUND ART

With miniaturization and high integration of electronic components in recent years, the problem of semi-permanent damage in which a memory chip or the like in an electronic device malfunctions, that is, the problem of so-called soft errors, becomes conspicuous. One of the causes of such a soft error is an α-ray generated from an α-ray source such as U, Th, Ra or the like contained in inorganic materials in the electronic components. For example, with miniaturization and high integration of electronic components, underfill layers constituting the electronic component become thinned, and as a result, there arises a problem that even weak α-rays derived from a solder resist layer affects the charges of memory chip.

Barium sulfate is made use of as a filler in various resin compositions. For instance, it is incorporated in a resist ink composition used for a resist layer of a printed wiring board. Thus, in recent years, there is an even stronger demand for low alpha dose barium sulfate to prevent the above-mentioned soft errors.

There are conventionally known two kinds of barium sulfate for industrial use, elutriation barium sulfate and precipitated barium sulfate. The former is obtained by crushing and classifying barite ore, and the latter is obtained by reducing barite ore, and leaching the generated barium sulfide into water to obtain an aqueous solution of barium sulfate, and applying a chemical synthesis method to the aqueous solution so that barium sulfide is reacted with sulfuric acid.

As a further example, there is known a method for obtaining barium sulfate having a narrow particle size distribution and improved dispersibility in which an aqueous solution of barium sulfide is reacted with ammonium sulfate (see Patent Document 1). However, no mention is made of reduction of α-ray dosage of barium sulfate therein.

A method for producing low alpha dose barium hydroxide or barium carbonate by applying a chemical synthesis method to an aqueous solution of barium sulfide as a starting material is already known (see Patent Document 2).

However, in recent years, a further reduction in α-ray dosage has been required not only for barium hydroxide and barium carbonate but also for barium sulfate itself. However, sufficiently low alpha dose barium sulfate has not yet been known, and as a matter of course, a method for producing barium sulfate having such a sufficiently low alpha dose in an efficient manner has not yet been known.

PRIOR ART

Patent Document

Patent Document 1: JP 2008-50261A
Patent Document 2: JPH 11-92139A

SUMMARY OF INVENTION

Technical Problems

The present inventors have intensively studied to solve the above-mentioned problems of low alpha dose barium sulfate and production thereof, and as a result, they have found that even barium sulfate produced by chemical synthesis, which has been thought to have a small alpha dose, it is not suited for use in the aforesaid electronic components, if the starting low materials used for the chemical synthesis are not such that they have been sufficiently reduced in alpha dose they have.

The inventors have found that when barite ore is crushed to obtain a crushed ore having an average particle diameter of 5 to 50 μm and an alpha dose of 1 cph/cm$^2$ or less; it is subjected to an elutriation treatment and/or a sieving treatment to remove coarse particles having a high silica content to obtain a first product; the first product is reduced in the silica content to a predetermined content according to the silica content of the crushed ore, the thus obtained first product is reduced to obtain barium sulfide as a second product; and then a conventionally known chemical synthesis method is applied to the second product, then a low alpha dose barium sulfate particle having a silica content of 0.6% by weight or less and an alpha dose of 0.07 cph/cm$^2$ or less is obtained, and thus completed the invention.

Incidentally, commercially available barium sulfate manufactured by Kishida Chemical Co., Ltd. (First grade, purity 98.0%) has a silica content of 0.18% by weight and an alpha dose of 3.36 cph/cm$^2$; one manufactured by Wako Pure Chemical Industries, Ltd. (Wako First grade) has a silica content of 0.18% by weight and an alpha dose of 3.19 cph/cm$^2$; one manufactured by Sigma-Aldrich (Purity 99%) has a silica content of 0.18% by weight and an alpha dose of 1.00 cph/cm$^2$; barium sulfate BAX-40 according to the Japanese Pharmacopeia (manufactured by Sakai Chemical Industry Co., Ltd. and having an average particle diameter of 5.0 μm) has a silica content of 0.1.7% by weight and an alpha dose of 2.03 cph/cm$^2$; and barium sulfate BAX-80 according to the Japanese Pharmacopeia (manufactured by Sakai Chemical industry Co., Ltd. and having an average particle diameter of 9.0 μm) has a silica content of 0.1.7% by weight and an alpha dose of 2.40 cph/cm$^2$.

Accordingly, it is an object of the invention to provide a low alpha dose barium sulfate particle having a silica content of 0.6% by weight or less and an alpha dose of 0.07 cph/cm$^2$ or less, and a process for producing such a low alpha dose barium sulfate particle.

It is a further object of the invention to provide use of such a low alpha dose barium sulfate particle, for example, use in a resin composition, in particular, a coating composition or a resist ink composition.

Solution to Problem

The invention provides a low alpha dose barium sulfate particle having a silica content of 0.6% by weight or less and an alpha dose of 0.07 cph/cm$^2$ or less.

The invention further provides a low alpha dose barium sulfate particle surface-treated with at least one selected from silica, silica hydrate and aluminum hydroxide.

The invention also provides a resin composition and a coating composition comprising the above-mentioned low alpha dose barium sulfate particle, and in particular, a resist ink composition.

In addition, the invention provides a process for producing a low alpha dose barium sulfate particle, which comprises:

a step (1) for subjecting (1) a crushed ore having an average particle diameter of 5-50 μm, an alpha dose of 1 cph/cm$^2$ or less, and a silica content of 0.65% by weight or more and 1.6% by weight or less, or (2) a crushed ore having an average particle diameter of 5-50 μm, an alpha dose of 1 cph/cm$^2$ or less, and a silica content of 1.6% by weight or more and 2.5% by weight or less, or (3) a crushed ore having an average particle diameter of 5-50 μm, an alpha dose of 1 cph/cm$^2$ or less, and a silica content of 2.5% by weight or more, wherein the crushed ore is obtained by crushing barite ore, to (a) an elutriation treatment, or (b) a sieving treatment, or (c) an elutriation treatment and a sieving treatment, thereby obtaining as a first product:

a crushed ore having a silica content of 0.65% by weight or less in the case of the crushed ore (1), or a crushed ore having a silica content of 1.55% by weight or less in the case of the crushed ore (2), or a crushed ore having a silica content of 2.5% by weight or less in the case of the crushed ore (3);

a step (2) in which the first product is reduced with a reducing agent to generate barium sulfide as a second product, and the barium sulfide is leached into water to obtain an aqueous solution of barium sulfide; and a step (3) in which, to the aqueous solution of barium sulfide, (a) an aqueous solution of an alkali metal sulfate is added, or (b) sulfuric acid is added, or (c) hydrochloric acid is added to obtain an aqueous solution of barium chloride; the barium chloride is precipitated; the barium chloride obtained is dissolved in water to obtain an aqueous solution of barium chloride; to the aqueous solution of barium chloride an aqueous solution of an alkali metal sulfate is added to effect the reaction of the aqueous solution of barium chloride with the alkali metal sulfate, or (d) hydrochloric acid is added to obtain an aqueous solution of barium chloride, the barium chloride is precipitated, the barium chloride obtained is dissolved in water to obtain an aqueous solution of barium chloride, the aqueous solution of barium chloride is caustified to obtain an aqueous solution of barium hydroxide, and the aqueous solution of barium hydroxide is reacted with sulfuric acid, thereby to generate barium sulfate as a third product, the barium sulfate is precipitated and recovered to obtain a low alpha dose barium sulfate particle having a silica content of 0.6% by weight or less and an alpha dose of 0.07 cph/cm$^2$ or less.

According to the process of the invention described above, the step (1) may be carried out after the crushed ore obtained by crushing barite ore has been subjected to a heating treatment in the presence of an acid, that is, an acid heating treatment.

Further according to the invention, there is provided a process for producing a surface-treated low alpha dose barium sulfate particle having an alpha dose of 0.07 cph/cm$^2$ or less. According to the process, a low alpha dose barium sulfate particle is obtained by the above-mentioned steps (1) to (3), and then, in a step (4), the low alpha dose barium sulfate particle is surface-treated with at least one selected from silica, silica hydrate and aluminum hydroxide.

Advantageous Effects of Invention

According to the process of the invention, the crushed ore obtained by crushing barite ore and having an average particle diameter of 5 to 50 μm and an alpha dose of 1 cph/cm$^2$ or less is subjected to an elutriation treatment and/or a sieving treatment so that coarse particles containing a large amount of silica are removed to reduce the silica content of the crushed ore to a predetermined content according to the silica content that the crushed ore originally has, thereby to obtain a first product having a reduced silica content, and the first product is reduced to obtain barium sulfide as a second product, and then the barium sulfide is subjected to a conventionally known chemical synthesis, to obtain, as a third product, a low alpha dose barium sulfate particle having a silica content of 0.6% by weight or less and an alpha dose of 0.07 cph/cm$^2$ or less.

Moreover, according to the invention, it is possible to arbitrarily control the average particle diameter of the obtained barium sulfate particle, for example, from about 0.01 μm to several tens of μm, by way of example, from about 10 to 20 μm, at the stage of chemical synthesis step.

Therefore, according to the invention, for example, a low alpha dose barium sulfate particle having an average particle diameter of 1 μm or less is easily obtained without grinding the crushed ore used beforehand to an average particle diameter of 1 μm or less.

Such a low alpha dose barium sulfate particle having an average particle diameter of 1 μm or less is suitably used as fillers, for example, in a resist ink composition, as well as various resin compositions and coating compositions.

DESCRIPTION OF EMBODIMENTS

The process for producing a low alpha dose barium sulfate particle according to the invention will be described.

The invention provides a process for producing a low alpha dose barium sulfate particle, which comprises:

a step (1) subjecting (1) a crushed ore having an average particle diameter of 5-50 μm, an alpha dose of 1 cph/cm$^2$ or less, and a silica content of 0.65% by weight or more and 1.6% by weight or less, or (2) a crushed ore having an average particle diameter of 5-50 μm, an alpha dose of 1 cph/cm$^2$ or less, and a silica content of 1.6% by weight or more and 2.5% by weight or less, or (3) a crushed ore having an average particle diameter of 5-50 μm, an alpha dose of 1 cph/cm$^2$ or less, and a silica content of 2.5% by weight or more, wherein the crushed ore is obtained by crushing barite ore, to (a) as elutriation treatment, or (b) a sieving treatment, or (c) an elutriation treatment and a sieving treatment, thereby obtaining as a first product:

a crushed ore having a silica content of 0.65% by weight or less in the case of the crushed ore (1), a crushed ore having a silica content of 1.55% by weight or less in the case of the crushed ore (2), or a crushed ore having a silica content of 2.5% by weight in the case of the crushed ore (3);

a step (2) in which the first product is reduced with a reducing agent to generate barium sulfide as a second product, and the barium sulfide is leached into water to obtain an aqueous solution of barium sulfide; and a step (3) in which, to the aqueous solution of barium sulfide, (a) an aqueous solution of an alkali metal sulfate is added, or (b) sulfuric acid is added, or (c) hydrochloric acid is added to obtain an aqueous solution of barium chloride; the barium chloride is precipitated; the barium chloride obtained is dissolved in water to obtain an aqueous solution of barium chloride; to the aqueous solution of barium chloride an aqueous solution of an alkali metal sulfate is added to effect the reaction of the aqueous solution of barium chloride with the alkali metal sulfate, or (d) hydrochloric acid is added to obtain an aqueous solution of barium chloride, the barium chloride is precipitated, the barium chloride obtained is dissolved in water to obtain an aqueous solution of barium chloride, the aqueous solution of barium chloride is caustified to obtain an aqueous solution of barium hydroxide, and the aqueous solution of barium hydroxide is reacted with sulfuric acid, thereby to generate barium sulfate as a third product, the barium sulfate is precipitated and recovered to obtain a low alpha dose barium sulfate particle having a silica content of 0.6% by weight or less and an alpha dose of 0.07 cph/cm$^2$ or less.

The first process of the invention comprises, as the step (1), subjecting the crushed ore obtained by crushing barite ore and having an average particle diameter of 5 to 50 μm, an alpha dose of 1 cph/cm$^2$ or less and a silica content of more than 0.65% by weight and 1.6% by weight or less to:

(a) an elutriation treatment, or (b) a sieve treatment, or (c) an elutriation treatment and a sieving treatment, to obtain a crushed ore as a first product having a silica content of 0.65% by weight or less; and treating the first product in the step (2) and the step (3) to obtain a low alpha dose barium sulfate particle having a silica content of 0.6% by weight or less and an alpha dose of 0.07 cph/cm$^2$ or less to.

The second process of the invention comprises, as the step (1), subjecting the crushed ore obtained by crushing barite ore and having an average particle diameter of 5 to 50 μm, an alpha dose of 1 cph/cm$^2$ or less and a silica content of more than 1.6% by weight and 2.5% by weight or less to:

(a) an elutriation treatment, or (b) a sieve treatment, or (c) an elutriation treatment and a sieving treatment, to obtain a crushed ore as a first product having a silica content of 1.55% by weight or less; and treating the first product in the step (2) and the step (3) to obtain a low alpha dose barium sulfate particle having a silica content of 0.6% by weight or less and an alpha dose of 0.07 cph/cm$^2$ or less.

The third process of the invention comprises, as the step (1), subjecting the crushed ore obtained by crushing barite ore and having an average particle diameter of 5 to 50 μm, an alpha dose of 1 cph/cm$^2$ or less and a silica content of more than 2.5% by weight to;

(a) an elutriation treatment, or (b) a sieve treatment, or (c) an elutriation treatment and a sieving treatment, to obtain a crushed ore as a first product having a silica content of 2.5% by weight or less; and treating the first product in the step (2) and the step (3) to obtain a low alpha dose barium sulfate particle having a silica content of 0.6% by weight or less and an alpha dose of 0.07 cph/cm$^2$ or less.

In the first process of the invention, it is preferred that the crushed ore obtained by crushing barite ore and having an average particle diameter of 5 to 50 μm, an alpha dose of 1 cph/cm$^2$ or less, and a silica content of more than 0.65% by weight and 1.1% by weight or less is subjected to the step (1) to obtain a crushed ore having a silica content of 0.64% by weight or less.

In the second process of the invention, it is preferred that the crushed ore obtained by crushing barite ore and having an average particle diameter of 5 to 50 μm, an alpha dose of 1 cph/cm$^2$ or less, and a silica content of more than 1.6% by weight and 2% by weight or less, more preferably, more than 1.6% by weight and 1.8% by weight or less, is subjected to the step (1) to obtain a crushed ore having a silica content of 1.54% by weight or less.

In the third process of the invention, the crushed ore used preferably has a silica content of more than 2.5% by weight and 3.5% by weight or less. It is more preferred that the crushed ore obtained by crushing barite ore and having an average particle diameter of 5 to 50 μm, an alpha dose of 1 cph/cm$^2$ or less, and a silica content in a range of 3 to 3.4% by weight, more preferably in a range of 3.1 to 3.4% by weight, is subjected to the step (1) to obtain a crushed ore having a silica content of 2.4% by weight or less.

According to the invention, the crushed ore obtained by crushing barite ore preferably has an average particle diameter of 8 to 20 μm.

When the crushed ore used has an alpha dose of more than 1 cph/cm$^2$, even if such a crushed ore is treated in accordance with the invention, there is a possibility that a barium sulfate particle having an aimed alpha dose of 0.07 cph/cm$^2$ or less is not obtained.

Barite ore is different to a degree in the silica content and alpha dose depending on the area where it was mined. In the invention, each of the crushed ores of (1) to (3) having the silica content as mentioned hereinbefore is obtained by appropriately selecting barite ore used and crushing the same.

In the invention, some kinds of crushed ores obtained by crushing barite ores mined in China or Mexico are suitably used as the starting crushed ore as described above, although depending on the area where they were mined.

According to the process of the invention, the starting crushed ore is subjected to the above-mentioned elutriation treatment and/or sieving treatment in the step (1), to remove coarse particles having a high silica content depending on the silica content that the crushed ore has, to reduce the silica content of a crushed ore to the predetermined content, thereby to obtain the first product having the predetermined silica content.

As will be described later, the crushed ore may be first subjected to an acid heating treatment, and then to an elutriation treatment and/or a sieving treatment in the step (1), thereby the first product is obtained which is much reduced in the silica content.

The elutriation treatment is an operation of sorting solid particles in a fluid based on the difference in the specific gravity of the solid particles to be sorted. According to the invention, an aqueous slurry of the crushed ore is placed in an elutriation bath, and elutriation water is supplied to an elutriation bath from the lower part thereof at a constant rate while a supernatant in the elutriation bath is recovered at the same rate at which the elutriation water is supplied, thereby an aqueous slurry of the crushed ore is separated into two layers of a slurry layer containing a crushed ore having a large content of barium sulfate and hence having a large specific gravity and a supernatant layer containing a crushed ore having a large content of silica and hence having a small specific gravity.

The crushed ore having a large content of barium sulfate and a large specific gravity has a high sedimentation rate in the elutriation bath, whereas the crushed ore having a large content of silica and a small specific gravity has a small sedimentation rate in the elutriation bath. Accordingly, the crushed ore having a large content of barium sulfate and a large specific gravity is recovered as an underflow from the elutriation bath, while the crushed ore having a large silica content and a small specific gravity is recovered as an overflow from the elutriation bath.

Thus, according to the invention, the crushed ore is effectively separated into two: a crushed ore having a large content of barium sulfate and a large specific gravity and a crushed ore having a large content of silica and a low specific gravity by means of elutriation treatment. Incidentally, barium sulfate has a specific gravity of 4.5, while silica has a specific gravity of 2.2.

Various impurity components having a small specific gravity and impurity components having a small particle diameter are also removed by the elutriating treatment of the crushed ore.

The factors influencing the separation efficiency of solid particles by an elutriation treatment generally include the particle diameter of the solid particles to be sorted, the density of the solid particles to be sorted, and the density and viscosity of the fluid used in the elutriation treatment and the rate at which it is supplied to the elutriation bath.

In the invention, although not particularly limited, elutriation water which is adjusted to have a pH of 3 or less, preferably a pH of 2 or less, by using an inorganic acid such as sulfuric acid or hydrochloric acid or an organic acid is preferably used, and at the same time, the slurry layer containing the crushed ore having a high content of barium sulfate and having a large specific gravity is preferably adjusted to occupy about 70 to 90% of the total volume of the slurry charged in the elutriation bath by controlling the rate at which elutriation water is supplied to the elutriation bath.

In this manner, the crushed ore having a high content of silica and a small specific gravity is accelerated to be floated or levitated to a supernatant layer in the elutriation bath. Hence the crushed ore having a large content of silica and a low specific gravity is separated effectively as an overflow from the elutriation bath from the crushed ore having a large content of barium sulfate and a large specific gravity. In the invention, water containing sulfuric acid is particularly preferred as an acidic elutriation water.

The sieving treatment refers to an operation of sorting solid particles based on the particle diameter of the solid particles to be sorted. In the invention, it is preferred that the elutriation treatment and the sieving treatment are performed in this order when performing the elutriation treatment and the sieving treatment in the step (1).

Among the crushed ores obtained by crushing barite ore, the crushed ore which contains a large amount of barium sulfate has usually a particle size of about 10 μm while the crushed ore containing a large amount of silica does not have the same small particle size as the crushed ore containing a large amount of barium sulfate on account of the difference in hardness between barium sulfate (having a Mobs hardness of 3.5) and silica (having a Mohs hardness of 7). Most of the crushed ores containing a large amount of silica remain as coarse particles having a diameter of 40 μm or more after barite ore has been crushed.

It has been found by the inventors that in the crushed ore obtained by crushing barite ore to an average particle diameter of about 5 to 50 μm, preferably about 8 to 20 μm, for example, to an average particle diameter of about 10 μm, the crushed ore containing a large amount of silica tends to remain as coarse particles in the crushed ore because silica is harder than barium sulfate, and the coarse particles that are mainly composed of silica contain α-ray generating source components in a large amount.

Therefore, the crushed ore obtained by crushing barite ore is elutriated and/or sieved in the step (1) to remove coarse particles, thereby effectively obtaining the first product that has been reduced in the amount of silica.

In order to efficiently separate coarse particles having a particle size of 40 μm or more and containing silica in a large amount from the crushed ore containing a large amount of barium sulfate and having a particle size of about 10 μm, it is preferred that a 500 mesh sieve (having an opening of 25 μm), a 400 mesh sieve (having an opening of 38 μm), or a 325 mesh sieve (having an opening 45 μm) is used. In particular, a sieve having a small sieve opening, for example, a 500 mesh sieve (having an opening of 25 μm) is preferably used.

When a slurry of crushed ore is treated with a wire sieve, fine particles having a large content of barium sulfate and a particle size of about 10 μm promptly pass through the sieve, whereas coarse particles having a large content of silica and a particle size of 40 μm or more remain on the sieve as they hardly pass through the sieve. As a result, according to the invention, the coarse particles having a particle diameter of 40 μm or more and a large content of silica are efficiently separated from the crushed ore having a large content of barium sulfate and a particle size of about 10 μm.

Thus, according to the invention, the crushed ore obtained by crushing barite ore is subjected to the elutriation treatment and/or the sieving treatment in the step (1) to remove coarse particles having a high silica content, thereby to reduce the silica content of the crushed ore to a predetermined one to obtain the first product having a reduced silica content depending on the silica content of the crushed ore that it originally has. The first product is then reduced with a reducing agent to obtain barium sulfide as the second product. The second product is then subjected to a conventionally known chemical synthesis method to provide, as the third product, a low alpha dose barium sulfate particle having a silica content of 0.6% by weight or less and an alpha dose of 0.07 cph/cm$^2$ or less. The reducing agent used is not particularly restricted, but, for example, carbon is mentioned as a preferable example.

As a method for producing a precipitated barium sulfate particle by means of chemical synthesis using an aqueous solution of barium sulfide as a starting material, the following is mentioned, for example.

(a) A first method in which a solution of an alkali metal sulfate is added to an aqueous solution of barium sulfide so that the barium sulfide is reacted with the alkali metal sulfate to precipitate barium sulfate; it is filtered, washed with water and dried to obtain a low alpha dose barium sulfate particle. Examples of the alkali metal sulfate include sodium sulfate, potassium sulfate, potassium sodium sulfate, ammonium sulfate, and the like.

(b) A second method in which sulfuric acid is added to an aqueous solution of barium sulfide so that the barium sulfide is reacted with sulfuric acid to precipitate barium sulfate; it is filtered, washed with water, and dried to obtain a low alpha dose barium sulfate particle.

(c) A third method in which hydrochloric acid is added to an aqueous solution of barium sulfide so that the barium sulfide is reacted with hydrochloric acid to obtain an aqueous solution of barium chloride; barium chloride is precipitated therefrom, and is then dissolved again in water to obtain an aqueous solution of barium chloride; an aqueous solution of alkali metal sulfate is added to the aqueous solution of barium chloride so that the barium sulfide is reacted with the alkali metal sulfate to precipitate barium sulfate; the barium sulfate precipitated is filtered, washed with water and dried to obtain a low alpha dose barium sulfate particle.

(d) A fourth method in which hydrochloric acid is added to an aqueous solution of barium sulfide so that the barium sulfide is reacted with hydrochloric acid to obtain an aqueous solution of barium chloride; the barium chloride thus obtained is precipitated therefrom; the barium chloride thus obtained is dissolved again in water to obtain an aqueous solution of barium chloride; an aqueous solution of sodium hydroxide is added to the aqueous solution of barium chloride to caustify the aqueous solution of barium chloride to obtain an aqueous solution of barium hydroxide; the barium hydroxide thus obtained is precipitated therefrom; the barium hydroxide thus obtained is dissolved again in water to obtain an aqueous solution of barium hydroxide; sulfuric acid is added to the aqueous solution of barium hydroxide so that the barium hydroxide is reacted with sulfuric acid to precipitate barium sulfate; the barium sulfate thus precipitated is filtered, washed with water, and dried to obtain a low alpha dose barium sulfate particle.

As is well known, the average particle diameter of barium sulfate particle obtained can be arbitrarily controlled by controlling the reaction conditions in the above-mentioned chemical synthesis method.

By way of example, according to the method (b) of the above-mentioned chemical synthesis, when the aqueous solution of barium sulfide obtained is reacted with an approximately equimolar amount of sulfuric acid, particles of barium sulfate having a particle diameter of several μm to several tens of μm are precipitated.

On the other hand, when the aqueous solution of barium sulfide obtained is reacted with sulfuric acid in a smaller amount or in a larger amount than the equimolar amount, particles of barium sulfate having a particle size of about 0.2 to 1 μm are precipitated. However, when the aqueous solution of barium sulfide obtained is reacted with sulfuric acid in a smaller amount or in a larger amount than the equimolar amount with vigorous stirring, very fine particles of barium sulfate having a particle size of about 0.01 to 0.1 μm are precipitated.

In this way, according to the invention, there is obtained a low alpha dose barium sulfate particle having an alpha dose of 0.07 cph/cm$^2$ or less and an arbitrary average particle diameter.

The low alpha dose barium sulfate particle obtained according to the invention has a purity of 96.5% or more, preferably 97.5% or more.

Thus, according to the invention, a low alpha dose barium sulfate particle having an average particle diameter of 1 μm or less is obtained. Such a low alpha dose barium sulfate particle is superior in dispersibility in a resin. Therefore, for example, a resin composition incorporated with the low alpha dose barium sulfate particle of the invention as a filler exhibits more effectively superior properties that barium sulfate possesses such as electrical insulating properties, heat resistance, chemical stability against an acid and an alkali, resistance to resin deterioration, and the like.

According to the invention, as described above, the step (1) may be carried out with the crushed ore after it has been subjected to the acid heating treatment, if necessary.

The acid heating treatment refers to an operation of heating an aqueous slurry of crushed ore in the presence of an acid. When an aqueous slurry of crushed ore is heated in the presence of an acid in this way, the crushed ore having a high content of silica is accelerated to be floated to a supernatant in an elutriation bath, so that the crushed ore having a high content of silica is readily removed by decantation.

More specifically, when the crushed ore is subjected to the acid heating treatment, and then the crushed ore treated in this way is treated by the step (1), the amount of silica of the crushed ore is much further reduced. Thus, when such a crushed ore is subjected to the subsequent steps, a barium sulfate particle having a much lower alpha dose is obtained. Moreover, a crushed ore from which aluminum, iron, potassium, calcium, sodium, magnesium, phosphorus components and the like have been removed is obtained.

In particular, according to the invention, when the crushed ore used has a relatively high silica content, the silica contained in the crushed ore is effectively removed by subjecting the crushed ore to the acid heating treatment. And, when such a crushed ore thus treated is treated according to the step (1), the first product which has been further reduced in the silica content is obtained. That is, even in the case the crushed ore has a relatively high silica content, when it is subjected to the acid heating treatment and then to the step (1) to the step (3), there is obtained barium sulfate having a low alpha dose which is substantially the same as barium sulfate obtained by use of crushed ore having a low silica content.

Also according to the invention, when the crushed ore having a relatively low silica content is subjected to the acid heating treatment, and then to the step (1) to the step (3), barium sulfate which is much more reduced in the alpha dose is obtained.

As described above, the low alpha dose barium sulfate particle obtained according to the invention has a silica content of 0.6% by weight or less and an alpha dose of 0.07 cph/cm$^2$ or less. It has a BET specific surface area usually in the range of 1 to 100 m$^2$/g, and preferably in the range of 1 to 75 m$^2$/g although not particularly limited.

The α-ray source present in the surface layer of barium sulfate particle has a stronger influence in the external environment than the α-ray source present inside the barium sulfate particle. The α-ray from the α-ray source present in the surface layer of barium sulfate particle exerts a strong influence in the external environment without being shielded. Therefore, it is believed that as the surface area of the particle is larger, the probability that α-ray sources are present on the surface of particle is increased, and the risk that soft errors occur in the external environment is increased. Therefore, when the product of alpha dose and BET specific surface area is taken as an index for the influence of α-rays, the smaller the value of the index is, the smaller the influence in the external environment of α-rays is.

As described above, the low alpha dose barium sulfate particle obtained according to the invention has an alpha dose of 0.07 cph/cm² at the most so that the value of product of alpha dose and BET specific surface area is remarkably small as compared with a barium sulfate particle having a large value of alpha dose. That is, the low alpha dose barium sulfate particle according to the invention has a small value of alpha dose so that in particular a particle having a small average particle diameter has a remarkably small value of product of alpha dose and BET specific surface area. Therefore, for example, a resist ink composition in which a particle having an average particle diameter of 1 μm or less is incorporated as a filler hardly causes soft errors as described above.

The low alpha dose barium sulfate particle is obtained as described above according to the invention. The low alpha dose barium sulfate particle may be surface-treated with at least one selected from silica, silica hydrate and aluminum hydroxide in order that it has an improved dispersibility in a resin composition or it has an improved compatibility with a resin component.

For the surface treatment of low alpha dose barium sulfate particle with silica hydrate, any known method may be adopted. For instance, an aqueous slurry of low alpha dose barium sulfate particle is heated to a temperature of 50 to 90° C. To the aqueous slurry is added an aqueous solution of sodium hydroxide, and then an aqueous solution of sodium silicate, and then sulfuric acid in this order, and the resulting mixture is stirred, filtered, washed with water, and dried.

Also for the surface treatment of low alpha dose barium sulfate particle with aluminum hydroxide, any known method may be adopted. For instance, an aqueous solution of sodium hydroxide is added to an aqueous slurry of low alpha dose barium sulfate particle, and then to the resulting mixture is added an aqueous solution of sodium aluminate and sulfuric acid, and the resulting is stirred, filtered, washed with water, and dried.

The amount of silica or silica hydrate with which the low alpha dose barium sulfate particle has been surface-treated, i.e., the surface-treated amount, is preferably in the range of 0.1 to 10% by weight in terms of silica based on the weight of the surface-treated low alpha dose barium sulfate particle, and in particular preferably in the range of 0.5 to 5% by weight. The amount of aluminum hydroxide with which the low alpha dose barium sulfate particle has been surface-treated, i.e., the surface-treated amount, is preferably in the range of 0.1 to 10% by weight in terms of alumina based on the weight of the surface-treated low alpha dose barium sulfate particle, and in particular preferably in the range of 0.5 to 5% by weight.

In either of the surface treatment with silica or silica hydrate, or the surface treatment with aluminum hydroxide, when the surface-treated amount is less than 0.1% by weight based on the surface-treated low alpha dose barium sulfate particle, the effect of surface treatment is not be sufficiently exerted, whereas when it exceeds 10% by weight, the desired function of barium sulfate may be deteriorated.

According to the present invention, the average particle diameter of the barium sulfate obtained can be arbitrarily controlled in the chemical synthesis stage as described hereinbefore. Therefore, a low alpha dose barium sulfate particle having a small average particle diameter is suitably used as a dispersoid in various aqueous or organic dispersions. For example, it is suitably incorporated as a filler in various resin compositions. Examples of the resin composition include a coating composition and a resist ink composition.

In general in the invention, the resin constituting the resin composition may be either a thermoplastic resin or a thermosetting resin. Specific examples include epoxy resin, phenol resin, polyphenylene sulfide (PPS) resin, polyester resin, polyamide, polyimide, maleimide resin, polystyrene, polyethylene, polypropylene, polyvinyl chloride, polyvinylidene chloride, fluororesin, polymethylmethacrylate, ethylene-ethyl acrylate copolymer (EEA) resin, polycarbonate, polyurethane, polyacetal, polyphenylene ether, polyether imide, acrylonitrile-butadiene-styrene copolymer (ABS) resin, liquid crystal resin (LCP), silicone resin, acrylic resin and the like.

In the resin composition, the amount of the low alpha dose barium sulfate particle used is not particularly limited, but it is usually in the range of 5 to 75% by volume, preferably in the range of 10 to 70% by volume, based on the total volume of the resin composition.

EXAMPLES

The invention will be described in detail with reference to examples and comparative examples hereinafter, but the invention is not limited by those examples.

In the following examples and comparative examples, the following barite ores were used:

Barite ore A: mined in China and having a content of barium sulfate of 95% by weight or more Barite ore B: mined in China and having a content of barium sulfate and strontium sulfate of 95% by weight or more Barite ore C: mined in China and having a content of barium sulfate and strontium sulfate of 95% by weight or more Barite ore D: mined in China and having a content of barium sulfate and strontium sulfate of 95% by weight or more Barite ore E: mined in Mexico and having a content of barium sulfate and strontium sulfate of 95% by weight or more In the following Examples and Comparative Examples, when an aqueous slurry of crushed ore obtained by crushing barite ore was first subjected to an acid heating treatment, a small amount of sample was extracted from the obtained aqueous slurry, dried, and the silica content was measured. The silica content is shown in the raw of acid heating treatment in Tables 1 and 2.

When an aqueous slurry of crushed ore was subjected to an elutriation treatment, a small amount of sample was extracted from the recovered underflow, filtered and dried, and then the silica content was measured. The silica content is shown in the raw of elutriation treatment in Tables 1 and 2.

When an aqueous slurry of crushed ore was subjected to a sieving treatment, the undersized slurry obtained was filtered, washed with water and dried, and then the silica content was measured. The silica content is shown in the raw of sieving treatment in Tables 1 and 2.

When barium sulfate was obtained by applying a chemical synthesis reaction to barium sulfide, the barium sulfate obtained was separated from the obtained reaction mixture by filtration, washed with water and dried, and then the alpha dose, the average particle diameter, the silica content and the BET specific surface area were measured. The product of the alpha dose and the specific surface area was calculated. These values are shown in the raw of low alpha dose barium sulfate in Tables 1 and 2.

Physical properties of the first product (barium sulfate as a crushed ore) and the third product (precipitated barium sulfate obtained by a chemical synthesis method and having a low alpha dose) obtained in the following Examples and Comparative Examples were evaluated as follows.

Alpha Dose (cph/cm$^2$)

The alpha dose was measured by use of a low level α-ray measuring apparatus LACS-4000 M (manufactured by Sumika Chemical Analysis Service, Ltd.). The sample was spread on a stainless steel plate (1000 cm$^2$) of the sample measurement section of the apparatus and was measured over a period of 99 hours.

Average Particle Diameter (D50) (μm)

The volume-based median diameter was measured by a laser diffraction/scattering type particle size distribution measuring apparatus Microtrac MT-3300 EXII (manufactured by Nikkiso Co., Ltd.).

Silica (SiO$_2$) Content (% by Weight)

The silica (SiO$_2$) content was measured by use of a fluorescent X-ray analyzer ZSX Primus II (manufactured by Rigaku Corporation). According to the already known method, the measurement of standard sample was conducted to prepare a calibration curve showing the relationship with the fluorescent X-ray intensity, based on which the quantity of silica was determined.

Alumina (Al$_2$O$_3$) Content (% by Weight)

The alumina (Al$_2$O$_3$) content was measured by use of a fluorescent X-ray analyzer ZSX Primus II (manufactured by Rigaku Corporation). According to the already known method, the measurement of standard sample was conducted to prepare a calibration curve showing the relationship with the fluorescent X-ray intensity, based on which the quantity of alumina was determined.

Composition of the Third Product (Precipitated Barium Sulfate Obtained by a Chemical Synthesis Method and Having a Low Alpha Dose)

As a result of analysis with an X-ray diffractometer Ultima II (manufactured by Rigaku Corporation) having a copper tube bulb, it was confirmed that the third product was barium sulfate in all the Examples and Comparative examples.

Amount of Silica or Alumina Coated on Low Alpha Dose Barium Sulfate Particle by Surface Treatment (Surface Treated Amount)

The surface treated amount was measured by use of a fluorescent X-ray analyzer ZSX Primus II (manufactured by Rigaku Corporation). According to the already known method, the measurement of standard sample was conducted to prepare a calibration curve showing the relationship with the fluorescent X-ray intensity, based on which the surface-treated amount was determined.

Purity of Barium Sulfate (% by Weight)

The purity of barium sulfate was measured by use of a fluorescent X-ray analyzer ZSX Primus II (manufactured by Rigaku Corporation). According to the already known method, the measurement of standard sample was conducted to prepare a calibration curve showing the relationship with the fluorescent X-ray intensity, based on which the quantity of barium sulfate (BaSO$_4$) was determined.

Example 1

(The First Method)

Pure water was added to 1500 g of crushed ore obtained by crushing barite ore A and having an alpha dose of 0.13 cph/cm$^2$, an average particle diameter of 10.06 μm and a silica content of 0.70% by weight to prepare 12 L of a slurry having a concentration of 125 g/L as barium sulfate.

120 mL of 62.5% by weight sulfuric acid and 250 mL of 35% by weight hydrochloric acid were added to 30 L of pure water, and further pure water, to prepare a total of 60 L of elutriation water having a pH of 1.6.

The slurry was put in an elutriation bath having a capacity of 13 L. 60 L of the elutriation water was continuously introduced into an elutriation bath at a rate of 1 L/min. for one hour from the lower part of the elutriation bath while discarding an overflow from the elutriation bath. Subsequently, while the overflow was discarded, 60 L of pure water was introduced into the elutriation bath at a rate of 1 L/min, for one hour, to conduct an elutriation treatment, thereby an underflow was recovered as a slurry.

The slurry thus recovered was passed through a 400 mesh sieve (having an opening of 38 μm) to obtain an undersized slurry, which was then filtered, washed with water and dried to obtain the first product having a silica content of 0.51% by weight.

The first product and cokes were placed in a crucible and thoroughly mixed, and were then calcined in an electric furnace to obtain barium sulfide as the second product, which was then leached into pure water to obtain an aqueous solution of barium sulfide. A 30% by weight aqueous solution of sulfuric acid was added to the aqueous solution of barium sulfide to precipitate barium sulfate, which was filtered, washed with water and dried to obtain a low alpha dose barium sulfate particle as the third product having a silica content of 0.18% by weight and an alpha dose of 0.02 cph/cm$^2$.

Example 2

(The First Method)

Pure water was added to 1500 g of crushed ore obtained by crushing barite ore B and having an alpha dose of 0.45 cph/cm$^2$, an average particle diameter of 10.24 μm and a silica content of 0.90% by weight to prepare 1.2 L of a slurry having a concentration of 1.25 g/L as barium sulfate.

An aqueous slurry of crushed ore was subjected to an elutriation treatment in the same manner as in Example 1 to recover an underflow as a slurry. The slurry thus recovered was passed through a 400 mesh sieve (having an opening of 38 μm) to obtain an undersized slurry, which was filtered, washed with water and dried to obtain the first product having a silica content of 0.63% by weight.

The first product and cokes were placed in a crucible and thoroughly mixed, and were then calcined in an electric furnace to obtain barium sulfide as the second product, which was then leached into pure water to obtain an aqueous solution of barium sulfide. A 30% by weight aqueous solution of sulfuric acid was added to the aqueous solution of barium sulfide to precipitate barium sulfate, which was filtered, washed with water and dried to obtain a low alpha dose barium sulfate particle as the third product having a silica content of 0.18% by weight and an alpha dose of 0.04 cph/cm$^2$.

Example 3

(The First Method)

Pure water was added to 1500 g of crushed ore obtained by crushing barite ore B and having an alpha dose of 0.45 cph/cm$^2$, an average particle diameter of 10.24 μm and a silica content of 0.90% by weight to prepare 12 L of a slurry having a concentration of 125 g/L as barium sulfate.

An aqueous slurry of crushed ore was subjected to an elutriation treatment in the same manner as in Example 1 to recover an underflow as a slurry. The slurry thus recovered was passed through a 400 mesh sieve (having an opening of 38 μm) to obtain an undersized slurry, which was filtered, washed with water and dried to obtain the first product having a silica content of 0.63% by weight.

The first product and cokes were placed in a crucible and thoroughly mixed, and were then calcined in an electric furnace to obtain barium sulfide as the second product, which was then leached into pure water to obtain an aqueous solution of barium sulfide. An aqueous solution of sodium sulfate was added to the aqueous solution of barium sulfide to precipitate barium sulfate, which was filtered, washed with water and dried to obtain a low alpha dose barium sulfate particle as the third product having a silica content of 0.20% by weight and an alpha dose of 0.04 cph/cm$^2$.

Example 4

(The First Method)

Pure water was added to 1500 g of crushed ore obtained by crushing barite ore B and having an alpha dose of 0.45 cph/cm$^2$, an average particle diameter of 10.24 μm and a silica content of 0.90% by weight to prepare 12 L of a slurry having a concentration of 125 g/L as barium sulfate.

An aqueous slurry of crushed ore was subjected to an elutriation treatment in the same manner as in Example 1 to recover an underflow as a slurry. The slurry thus recovered was passed through a 400 mesh sieve (having an opening of 38 μm) to obtain an undersized slurry, which was filtered, washed with water and dried to obtain the first product having a silica content of 0.63% by weight.

The first product and cokes were placed in a crucible and thoroughly mixed, and were then calcined in an electric furnace to obtain barium sulfide as the second product, which was then leached into pure water to obtain an aqueous solution of barium sulfide. A 35% by weight aqueous solution of hydrochloric acid was added to the aqueous solution of barium sulfide, and then a saturated aqueous solution of barium chloride was prepared at a temperature of 60° C. Then the temperature of the saturated aqueous solution was lowered to 30° C. so that barium chloride was recrystallized.

The barium chloride thus obtained was again dissolved in water to prepare an aqueous solution of barium chloride, to which an aqueous solution of sodium sulfate was added to precipitate barium sulfate. The barium sulfate thus obtained was filtered, washed with water and dried to obtain a low alpha dose barium sulfate particle having a content of silica of 0.19% by weight and an alpha dose of 0.04 cph/cm$^2$.

Example 5

(The First Method)

Pure water was added to 1500 g of crushed ore obtained by crushing barite ore B and having an alpha dose of 0.45 cph/cm$^2$, an average particle diameter of 10.24 μm and a silica content of 0.90% by weight to prepare 12 L of a slurry having a concentration of 125 g/L as barium sulfate.

An aqueous slurry of crushed ore was subjected to an elutriation treatment in the same manner as in Example 1 to recover an underflow as a slurry. The slurry thus recovered was passed through a 400 mesh sieve (having an opening of 38 μm) to obtain an undersized slurry, which was filtered, washed with water and dried to obtain the first product having a silica content of 0.63% by weight.

The first product and cokes were placed in a crucible and thoroughly mixed, and were then calcined in an electric furnace to obtain barium sulfide as the second product, which was then leached into pure water to obtain an aqueous solution of barium sulfide. A 35% by weight aqueous solution of hydrochloric acid was added to the aqueous solution of barium sulfide, and a saturated aqueous solution of barium chloride was prepared at a temperature of 60° C. Then the temperature of the saturated aqueous solution was lowered to 30° C. so that barium chloride was recrystallized.

The barium chloride thus obtained was dissolved in water to prepare an aqueous solution of barium chloride, to which an aqueous solution of sodium hydroxide was added to causticize the aqueous solution of barium chloride to generate barium hydroxide. The barium hydroxide thus generated was recrystallized, and was then again dissolved in water to prepare an aqueous solution of barium hydroxide. 30% by weight sulfuric acid was added to the aqueous solution of barium hydroxide to precipitate barium sulfate, which was filtered, washed with water and dried to obtain a low alpha dose barium sulfate particle having a content of silica of 0.17% by weight and an alpha dose of 0.02 cph/cm$^2$ as the third product.

Example 6

(The Second Method)

125 mL of pure water was added to 1500 g of crushed ore obtained by crushing barite ore C and having an alpha dose of 0.95 cph/cm$^2$, an average particle diameter of 10.03 μm and a silica content of 1.71% by weight and sufficiently stirred to prepare a slurry.

437.5 mL of 62.5% by weight sulfuric acid and 125 mL of 35% by weight hydrochloric acid were added to the slurry. After thoroughly stirring, the slurry was heated to a temperature of 110° C. and an acid heating treatment was carried out at the temperature for 3 hours. The aqueous slurry of the crushed ore thus acid heat-treated in this way was cooled to room temperature and washed with water four times by decantation to obtain an acid heat-treated crushed ore.

Pure water was added to the acid heat-treated crushed ore to prepare 12 L of a slurry having a concentration of about 125 g/L as barium sulfate.

An aqueous slurry of crushed ore was subjected to an elutriation treatment in the same manner as in Example 1 to recover an underflow as a slurry. The slurry thus recovered was passed through a 400 mesh sieve (having an opening of 38 μm) to obtain an undersized slurry, which was filtered, washed with water and dried to obtain the first product having a silica content of 0.77% by weight.

The first product and cokes were placed in a crucible and thoroughly mixed, and were then calcined in an electric furnace to obtain barium sulfide as the second product, which was then leached into pure water to obtain an aqueous solution of barium sulfide. A 30% by weight sulfuric acid was added to the aqueous solution of barium sulfide to precipitate barium sulfate, which was filtered, washed with water and dried to obtain, as the third product, a low alpha dose barium sulfate particle having a content of silica of 0.18% by weight and an alpha dose of 0.04 cph/cm².

Example 7

(The First Method)

Pure water was added to 1500 g of crushed ore obtained by crushing barite ore A and having an alpha dose of 0.13 cph/cm², an average particle diameter of 10.06 μm and a silica content of 0.70% by weight to prepare 12 L of a slurry having a concentration of 125 g/L as barium sulfate.

The aqueous slurry of the crushed ore was subjected to an elutriation treatment in the same manner as in Example 1 to recover an underflow as a slurry. The slurry thus recovered was filtered and dried to obtain the first product having a silica content of 0.61% by weight.

The first product and cokes were placed in a crucible and thoroughly mixed, and were then calcined in an electric furnace to obtain barium sulfide as the second product, which was then leached into pure water to obtain an aqueous solution of barium sulfide.

35% by weight hydrochloric acid was added to the aqueous solution of barium sulfide and the resulting mixture was heated, followed by preparing a saturated aqueous solution of barium chloride at a temperature of 60° C. Thereafter, the temperature of the saturated aqueous solution is lowered to 30° C. to effect recrystallization to obtain barium chloride. The barium chloride thus obtained was again dissolved in pure water to prepare an aqueous solution of barium chloride, to which an aqueous solution of 30% by weight sodium hydroxide was added to effect causticization to produce barium hydroxide. The barium hydroxide thus obtained was recrystallized and dissolved in pure water again to prepare an aqueous solution of barium hydroxide, to which 30% by weight sulfuric acid was added to precipitate barium sulfate, which was filtered, washed with water, and dried to obtain, as the third product, a low alpha dose barium sulfate particle having a silica content of 0.18% by weight and an alpha dose of 0.02 cph/cm².

Example 8

(The First Method)

Pure water was added to 1500 g of crushed ore obtained by crushing barite ore A and having an alpha dose of 0.13 cph/cm², an average particle diameter of 10.06 μm and a silica content of 0.70% by weight to prepare 5 of a slurry having a concentration of 300 g/L as barium sulfate.

The slurry was sieved with a 400 mesh sieve (having an opening of 38 μm) to obtain an undersized slurry, which was filtered and dried to obtain the first product having a silica content of 0.64% by weight.

The first product and cokes were placed in a crucible and thoroughly mixed, and were then calcined in an electric furnace to obtain barium sulfide as the second product, which was then leached into pure water to obtain an aqueous solution of barium sulfide.

35% by weight hydrochloric acid was added to the aqueous solution of barium sulfide, and the resulting mixture was heated, followed by preparing a saturated aqueous solution of barium chloride at a temperature of 60° C. Thereafter, the temperature of the saturated aqueous solution is lowered to 30° C. to effect recrystallization to obtain barium chloride. The barium chloride thus obtained was again dissolved in pure water to prepare an aqueous solution of barium chloride, to which an aqueous solution of sodium sulfate was added to precipitate barium sulfate. The barium sulfate thus obtained was filtered, washed with water, and dried to obtain, as the third product, a low alpha dose barium sulfate particle having a silica content of 0.19% by weight and an alpha dose of 0.03 cph/cm².

Example 9

(The Second Method)

Pure water was added to 1500 g of crushed ore obtained by crushing barite ore C and having an alpha dose of 0.95 cph/cm², an average particle diameter of 10.03 μm and a silica content of 1.71% by weight to prepare 12 L of slurry of barium sulfate having a concentration of 125 g/L.

The aqueous slurry of the crushed ore was subjected to an elutriation treatment in the same manner as in Example 1 to recover an underfloor as a slurry. The slurry thus recovered filtered and dried to obtain the first product having a silica content of 1.35% by weight.

The first product and cokes were placed in a crucible and thoroughly mixed, and were then calcined in an electric furnace to obtain barium sulfide as the second product, which was then leached into pure water to obtain an aqueous solution of barium sulfide, to which an aqueous solution of sodium sulfate was added to precipitate barium sulfate. The barium sulfate thus obtained was filtered, washed with water and dried to obtain a low alpha dose barium sulfate particle having a content: of silica of 0.44% by weight and an alpha dose of 0.06 cph/cm².

Example 10

(The Second Method)

Pure water was added to 1500 g of crushed ore obtained by crushing barite ore C and having an alpha dose of 0.95 cph/cm², an average particle diameter of 10.03 μm and a silica content of 1.71% by weight to prepare 5 L of a slurry having a concentration of 300 g/L as barium sulfate.

The slurry of the crushed ore was sieved with a 400 mesh sieve (having an opening of 38 μm) to obtain an undersized slurry, which was filtered and dried to obtain the first product having a silica content of 1.46% by weight.

The first product and cokes were placed in a crucible and thoroughly mixed, and were then calcined in an electric furnace to obtain barium sulfide as the second product, which was then leached into pure water to obtain an aqueous solution of barium sulfide. An aqueous solution of sodium sulfate was added to the aqueous solution of barium sulfide to effect the reaction of barium sulfide with sodium sulfate to precipitate barium sulfate, which was filtered, washed with water and dried to obtain a low alpha dose barium sulfate particle having a content of silica of 0.56% by weight and an alpha dose of 0.07 cph/cm².

Example 11

(The Second Method)

Pure water was added to 1500 g of crushed ore obtained by crushing barite ore D and having an alpha dose of 0.99 cph/cm², an average particle diameter of 10.78 μm and a silica content of 1.76% by weight to prepare 5 L of a slurry having a concentration of 300 g/L as barium sulfate.

The slurry of the crushed ore was sieved with a 400 mesh sieve (having an opening of 38 μm) to obtain an undersized slurry, which was filtered and dried to obtain the first product having a silica content of 1.54% by weight.

The first product and cokes were placed in a crucible and thoroughly mixed, and were then calcined in an electric furnace to obtain barium sulfide as the second product, which was then leached into pure water to obtain an aqueous solution of barium sulfide. An aqueous solution of sodium sulfate was added to the aqueous solution of barium sulfide to effect the reaction of the barium sulfide with sodium sulfate to precipitate barium sulfate, which was filtered, washed with water and dried to obtain, as the third product, a low alpha dose barium sulfate particle having a content of silica of 0.59% by weight and an alpha dose of 0.07 cph/cm$^2$.

Example 12

(The First Method)
Pure water was added to 1500 g of crushed ore obtained by crushing barite ore B and having an alpha dose of 0.45 cph/cm$^2$, an average particle diameter of 10.24 µm and a silica content of 0.90% by weight to prepare 12 L of slurry of barium sulfate having a concentration of 125 g/L.

The aqueous slurry of the crushed ore was subjected to an elutriation treatment in the same manner as in Example 1 to recover an underflow as a slurry. The slurry thus recovered was sieved with a 400 mesh sieve (having an opening of 38 µm) to obtain an undersized slurry, which was filtered, washed and dried to obtain the first product having a silica content of 0.63% by weight.

The first product and cokes were placed in a crucible and thoroughly mixed, and were then calcined in an electric furnace to obtain barium sulfide as the second product, which was then leached into pure water to obtain an aqueous solution of barium sulfide. 30% by weight sulfuric acid was added to the aqueous solution of barium sulfide to effect the reaction of barium sulfide with sulfuric acid to precipitate barium sulfate, which was filtered, washed with water and dried to obtain, as the third product, a low alpha dose barium sulfate particle having a content of silica of 0.18% by weight and an alpha dose of 0.04 cph/cm$^2$.

The barium sulfate thus obtained was dispersed in pure water to obtain a slurry having a concentration of 150 g/L in terms of barium sulfate. While 8 L of the slurry (1200 g as barium sulfate) was stirred, it was heated to a temperature of 70° C., and then an aqueous solution of 30% by weight sodium hydroxide was added to the slurry to adjust the pH of the slurry at 9.5, whereupon 85 mL of an aqueous solution of sodium silicate (141 g/L in terms of silica) was added all at once to the slurry, followed by dropwise addition of 25.5 mL of 30% by weight sulfuric acid quantitatively over 120 minutes, and stirring was continued for 60 minutes.

Thereafter, the obtained slurry was cooled to 10° C., and an aqueous solution of 30% by weight sodium hydroxide was added to the slurry to adjust the pH thereof at 8.5. Subsequently, 108 of an aqueous solution of sodium aluminate having a concentration of 267 g/L in terms of alumina and 162 mL of 30% by weight sulfuric acid were added quantitatively over 90 minutes so as to maintain the pH of the slurry at 8.5, followed by continuing stirring the mixture over 30 minutes.

The mixture obtained was then filtered, washed with water and dried to obtain a silica- and aluminum hydroxide-coated low alpha dose barium sulfate particle having a silica content of 1.17% by weight, an alumina content of 1.74% by weight, a BET specific surface area of 17.0 m$^2$/g, and the product of alpha dose and specific surface area of 6800 cph/g.

Example 13

(The First Method)
Pure water was added to 1500 g of crushed ore obtained by crushing barite ore A and having an alpha dose of 0.13 cph/cm$^2$, an average particle diameter of 10.06 µm and a silica content of 0.70% by weight to prepare 12 L of a slurry having a concentration of 125 g/L as barium sulfate.

120 mL of 62.5% by weight sulfuric acid and 250 mL of 35% by weight hydrochloric acid were added to 30 L of pure water, and further pure water was added, to prepare a total of 60 L of elutriation water having a pH of 1.6.

The slurry was put in an elutriation bath having a capacity of 13 L. 60 L of the elutriation water was continuously introduced into an elutriation bath at a rate of 1 L/min. for one hour from the lower part of the elutriation bath while discarding an overflow from the elutriation bath. Subsequently, while the overflow was discarded, 60 L of pure water was introduced into the elutriation bath at a rate of 1 L/min. for one hour, to conduct an elutriation treatment, thereby an underflow was recovered as a slurry.

The slurry thus recovered was passed through a 400 mesh sieve (having an opening of 38 µm) to obtain an undersized slurry, which was then filtered, washed with water and dried to obtain the first product having a silica content of 0.51% by weight.

The first product and cokes were placed in a crucible and thoroughly mixed, and were then calcined in an electric furnace to obtain barium sulfide as the second product, which was then leached into pure water to obtain an aqueous solution of barium sulfide. A 30% by weight aqueous solution of sulfuric acid was added to the aqueous solution of barium sulfide with vigorous stirring to precipitate barium sulfate, which was filtered, washed with water and dried to obtain a low alpha dose barium sulfate particle as the third product having a silica content of 0.19% by weight and an alpha dose of 0.02 cph/cm$^2$.

Example 14

(The First Method)
Pure water was added to 1500 g of crushed ore obtained by crushing barite ore A and having an alpha dose of 0.13 cph/cm$^2$, an average particle diameter of 10.06 µm and a silica content of 0.70% by weight to prepare 12 L of a slurry having a concentration of 125 g/L as barium sulfate.

120 mL of 62.5% by weight sulfuric acid and 250 mL of 35% by weight hydrochloric acid were added to 30 L of pure water, and further pure water, to prepare a total of 60 L of elutriation water having a pH of 1.6.

The slurry was put in an elutriation bath having a capacity of 13 L. 60 L of the elutriation water was continuously introduced into an elutriation bath at a rate of 1 L/min. for one hour from the lower part of the elutriation bath while discarding an overflow from the elutriation bath. Subsequently, while the overflow was discarded, 60 L of pure water was introduced into the elutriation bath at a rate of 1 L/min. for one hour, to conduct an elutriation treatment, thereby an underflow was recovered as a slurry.

The slurry thus recovered was passed through a 400 mesh sieve (having an opening of 38 µm) to obtain an undersized slurry, which was filtered, washed with water and dried to obtain the first product having a silica content of 0.51% by weight.

The first product and cokes were placed in a crucible and thoroughly mixed, and were then calcined in an electric furnace to obtain barium sulfide as the second product, which was then leached into pure water to obtain an aqueous solution of barium sulfide. A 30% by weight aqueous solution of sulfuric acid was added to the aqueous solution of barium sulfide in such a manner that the amount of sulfuric acid added was equivalent to the barium sulfide thereby to precipitate barium sulfate, which was filtered, washed with water and dried to obtain, as the third product, a low alpha dose barium sulfate particle having a silica content of 0.20% by weight, and an alpha dose of 0.02 cph/cm$^2$.

Example 15

(The Third Method)

Pure water was added to 1500 g of crushed ore obtained by crushing barite ore E and having an alpha dose of 0.49 cph/cm$^2$, an average particle diameter of 10.53 μm and a silica content of 3.24% by weight to prepare 12 L of slurry of barium sulfate having a concentration of 125 g/L.

The aqueous slurry of the crushed ore was subjected to an elutriation treatment in the same manner as in Example 1 to recover an underflow as a slurry. The slurry thus recovered as the underflow was filtered and dried to obtain the first product having a silica content of 2.15% by weight.

The first product and cokes were placed in a crucible and thoroughly mixed, and were then calcined in an electric furnace to obtain barium sulfide as the second product, which was then leached into pure water to obtain an aqueous solution of barium sulfide. An aqueous solution of sodium sulfate was added to the aqueous solution of barium sulfide to precipitate barium sulfate. The barium sulfate thus obtained was filtered, washed with water and dried to obtain, as the third product, a low alpha dose barium sulfate particle having a content of silica of 0.42% by weight and an alpha dose of 0.06 cph/cm$^2$.

Example 16

(The Third Method)

Pure water was added to 1500 g of crushed ore obtained by crushing barite ore E and having an alpha dose of 0.49 cph/cm$^2$, an average particle diameter of 10.53 μm and a silica content of 3.42% by weight to prepare 5 L of a slurry having a concentration of 300 g/L as barium sulfate.

The slurry ore was sieved with a 400 mesh sieve (having an opening of 38 μm) to obtain an undersized slurry, which was filtered and dried to obtain the first product having a silica content of 2.32% by weight.

The first product and cokes were placed in a crucible and thoroughly mixed, and were then calcined in an electric furnace to obtain barium sulfide as the second product, which was then leached into pure water to obtain an aqueous solution of barium sulfide. An aqueous solution of sodium sulfate was added to the aqueous solution of barium sulfide to effect the reaction of barium sulfide with sodium sulfate to precipitate barium sulfate. The barium sulfate thus obtained was filtered, washed with water and dried to obtain, as the third product, a low alpha dose barium sulfate particle having a content of silica of 0.55% by weight and an alpha dose of 0.07 cph/cm$^2$.

Comparative Example 1

The crushed ore obtained by crushing barite ore C having an alpha dose of 0.95 cph/cm$^2$, an average particle diameter of 10.03 μm and a silica content of 1.71% by weight and cokes were placed in a crucible and thoroughly mixed, and then calcined in an electric furnace to obtain barium sulfide, which was then leached into pure water to obtain an aqueous solution of barium sulfide. A 30% by weight aqueous solution of sulfuric acid was added to the aqueous solution of barium sulfide to effect the reaction of barium sulfide with sulfuric acid to precipitate barium sulfate. The barium sulfate thus obtained was filtered, washed with water and dried to obtain barium sulfate having a content of silica of 0.96% by weight and an alpha dose of 0.47 cph/cm$^2$.

Comparative Example 2

The crushed ore obtained by crushing barite ore A having an alpha dose of 0.13 cph/cm$^2$, an average particle diameter of 10.06 μm and a silica content of 0.70% by weight and cokes were placed in a crucible and thoroughly mixed, and then calcined in an electric furnace to obtain barium sulfide, which was then leached into pure water to obtain an aqueous solution of barium sulfide. A 30% by weight aqueous solution of sulfuric acid was added to the aqueous solution of barium sulfide to effect the reaction of barium sulfide with sulfuric acid to precipitate barium sulfate. The barium sulfate thus obtained was filtered, washed with water and dried to obtain barium sulfate having a content of silica of 0.73% by weight and an alpha dose of 0.08 cph/cm$^2$.

TABLE 1

| | EXAMPLES | | | | | | | | |
|---|---|---|---|---|---|---|---|---|---|
| | 1 | 2 | 3 | 4 | 5 | 6 | 7 | 8 | 9 |
| Barite ore | A | B | B | B | B | C | A | A | C |
| Crushed ore | | | | | | | | | |
| Silica content (% by weight) | 0.70 | 0.90 | 0.90 | 0.90 | 0.90 | 1.71 | 0.70 | 0.70 | 1.71 |
| Average particle size (μm) | 10.06 | 10.24 | 10.24 | 10.24 | 10.24 | 10.03 | 10.06 | 10.06 | 10.03 |
| Alpha dose (cph/cm$^2$) | 0.13 | 0.45 | 0.45 | 0.45 | 0.45 | 0.95 | 0.13 | 0.13 | 0.95 |
| Acid heating treatment | No | No | No | No | No | | No | No | No |
| Silica content (% by weight) | | | | | | 1.28 | | | |
| Elutriation treatment | | | | | | | | No | |
| Silica content (% by weight) | 0.61 | 0.72 | 0.72 | 0.72 | 0.72 | 0.86 | 0.61 | | 1.35 |
| Average particle size (μm) | | | | | | | | 9.97 | 9.73 |
| Alpha dose (cph/cm$^2$) | | | | | | | | 0.09 | 0.56 |
| Sieving treatment | | | | | | | | No | No |
| Silica content (% by weight) | 0.51 | 0.63 | 0.63 | 0.63 | 0.63 | 0.77 | | 0.64 | |
| Average particle size (μm) | 10.01 | 9.87 | 9.87 | 9.87 | 9.87 | 9.73 | | 9.95 | |
| Alpha dose (cph/cm$^2$) | 0.07 | 0.09 | 0.09 | 0.09 | 0.09 | 0.19 | | 0.10 | |
| Chemical synthesis | b | b | a | c | d | b | d | c | a |

TABLE 1-continued

| | EXAMPLES | | | | | | | | |
|---|---|---|---|---|---|---|---|---|---|
| | 1 | 2 | 3 | 4 | 5 | 6 | 7 | 8 | 9 |
| Low α-ray dose $BaSO_4$ | | | | | | | | | |
| Silica content (% by weight) | 0.18 | 0.18 | 0.20 | 0.19 | 0.17 | 0.18 | 0.18 | 0.19 | 0.44 |
| Average particle size (μm) | 0.28 | 0.30 | 0.30 | 0.27 | 0.27 | 0.29 | 0.29 | 0.28 | 0.28 |
| Alpha dose (cph/cm$^2$) | 0.02 | 0.04 | 0.04 | 0.04 | 0.02 | 0.04 | 0.02 | 0.03 | 0.06 |
| BET specific surface area (m$^2$/g) | 12.4 | 12.0 | 12.2 | 12.8 | 12.9 | 12.6 | 12.5 | 12.6 | 12.5 |
| Alpha dose × BET specific surface area (cph/g) | 2480 | 4800 | 4880 | 5120 | 2580 | 5040 | 2500 | 3780 | 7500 |
| Purity of $BaSO_4$ (% by weight) | 98.4 | 98.2 | 98.1 | 98.1 | 98.5 | 97.8 | 98.4 | 98.6 | 97.9 |

TABLE 2

| | EXAMPLES | | | | | | | COMPARATIVE | |
|---|---|---|---|---|---|---|---|---|---|
| | 10 | 11 | 12 | 13 | 14 | 15 | 16 | 1 | 2 |
| Barite ore | C | D | B | A | A | E | E | C | A |
| Crushed ore | | | | | | | | | |
| Silica content (% by weight) | 1.71 | 1.76 | 0.90 | 0.70 | 0.70 | 3.24 | 3.24 | 1.71 | 0.70 |
| Average particle size (μm) | 10.03 | 10.78 | 10.24 | 10.06 | 10.06 | 10.53 | 10.53 | 10.03 | 10.06 |
| Alpha dose (cph/cm$^2$) | 0.95 | 0.99 | 0.45 | 0.13 | 0.13 | 0.49 | 0.49 | 0.95 | 0.13 |
| Acid heating treatment | No | No | No | No | No | No | No | No | No |
| Silica content (% by weight) | | | | | | | | | |
| Elutriation treatment | No | No | | | | | | No | No |
| Silica content (% by weight) | | | 0.72 | 0.61 | 0.61 | 2.15 | | | |
| Average particle size (μm) | | | | | | 10.11 | | | |
| Alpha dose (cph/cm$^2$) | | | | | | 0.32 | | | |
| Sieving treatment | | | | | | No | | No | No |
| Silica content (% by weight) | 1.46 | 1.54 | 0.63 | 0.51 | 0.51 | | 2.32 | | |
| Average particle size (μm) | 9.73 | 10.12 | 9.87 | 10.01 | 10.01 | | 10.03 | | |
| Alpha dose (cph/cm$^2$) | 0.67 | 0.73 | 0.09 | 0.07 | 0.07 | | 0.34 | | |
| Chemical synthesis | a | a | b | b | b | a | a | b | b |
| Low α-ray dose $BaSO_4$ | | | | | | | | | |
| Silica content (% by weight) | 0.56 | 0.59 | 0.18 | 0.19 | 0.20 | 0.42 | 0.55 | 0.96 | 0.73 |
| Average particle size (μm) | 0.30 | 0.29 | 0.30 | 0.10 | 14.3 | 0.30 | 0.30 | 0.29 | 0.29 |
| Alpha dose (cph/cm$^2$) | 0.07 | 0.07 | 0.04 | 0.02 | 0.02 | 0.06 | 0.07 | 0.47 | 0.08 |
| BET specific surface area (m$^2$/g) | 12.1 | 12.2 | 12.0 | 73.4 | 1.1 | 12.3 | 12.2 | 12.4 | 12.3 |
| Alpha dose × BET specific surface area (cph/g) | 8470 | 8540 | 4800 | 14680 | 220 | 7380 | 8540 | 58280 | 9840 |
| Purity of $BaSO_4$ (% by weight) | 98.0 | 97.8 | 98.2 | 98.3 | 98.4 | 98.6 | 98.5 | 97.4 | 98.1 |

As shown in Tables 1 and 2, a low alpha dose barium sulfate particle having a silica content of 0.6% by weight or less and an alpha dose of 0.07 cph/cm$^2$ or less is obtained according to the process of the invention.

In contrast, according to Comparative Examples 1 and 2, the crushed ore obtained by crushing barite ore was not subjected to an elutriation treatment or a sieving treatment but was reduced as it was with carbon and leached into water to obtain an aqueous solution of barium sulfide, and the aqueous solution of barium sulfide was used as a starting material and was subjected to chemical synthesis. As a result, the obtained barium sulfate was found to have still a high alpha dose.

Example 17

(Preparation of Coating Composition and Alpha Dose of Coating Film Obtained)

16 g of barium sulfate obtained in Example 11, 20 g of varnish (ACRYDIC A-801-P, manufactured by DIC Corporation), 10 g of butyl acetate (of guaranteed reagent; manufactured by Wako Pure Chemical Industry Co., Ltd.), 10 g of xylene (of guaranteed reagent; manufactured by Junsei Chemical Co., Ltd.), and 76 g of glass beads (1.5 mm in diameter; manufactured by Potters-Ballotini Co., Ltd.) were placed in a 140 mL capacity mayonnaise bottle. After thoroughly mixing the content, the mayonnaise bottle was fixed to a paint conditioner 5410 (manufactured by RED DEVIL Equipment Co.), subjected to shaking for 60 minutes, and then subjected to dispersion treatment to prepare a coating composition.

The coating composition was dropped on polyethylene film, and a coating film was formed thereon using a bar coater (No. 579 ROD No. 6, manufactured by Yasuda Seiki Seisakusho, Ltd.) having a pigment weight concentration (PWC) of 61.5% by weight.

After drying the coating film at 20° C. for 12 hours, the alpha dose was measured using a low level α-ray measuring device LACS-4000M (manufactured by Sumika Chemical Service, Ltd.) to find that it had an alpha dose of 0.04 cph/cm$^2$. In the measurement, the coating film was placed on a stainless steel plate (1000 cm$^2$) of the sample measuring section of the apparatus and measured over a period of 99 hours.

Comparative Example 3

(Preparation of Coating Composition and Alpha Dose of Coating Film Obtained)

A coating composition was prepared in the same manner as in Example 17 except that barium sulfate obtained in Comparative Example 1 was used in place of barium sulfate obtained in Example 11. The coating film was found to have an alpha dose of 0.28 cph/cm$^2$.

Example 18

(Preparation of Resin Composition Sheet and Measurement of Alpha Dose Thereof)

56 g of barium sulfate obtained in Example 11 and 24 g of ethylene-ethyl acrylate copolymer resin (EEA resin manufactured by Japan Polyethylene Corporation, Rexpearl (Registered trademark) A 1150) was kneaded for 10 minutes using a LABO PLASTMILL (manufactured by Toyo Seiki Seisaku-Sho, Ltd.) under the conditions of rotation rate of mixer of 40 rpm and 150° C.

The kneaded product obtained was taken out of the mixer, and was placed on the center of a stainless steel mold plate (150 mm×200 mm) having a thickness of 2 mm. It was sandwiched between a pair of stainless steel plates (200 mm×300 mm) and placed on a sample stand of MINI TEST PRESS 10 (manufactured by Toyo Seiki Seisaku-Sho, Ltd.), and pressurized at 0.5 MPa for 2 minutes while heating at 160° C., the pressure was further raised to 5 MPa and pressurized for 2 minutes while heating at 160° C., and then the pressure was increased to 25 MPa and pressurized for 3 minutes while heating at 160° C.

Thereafter, while pressurizing at 25 MPa, it was cooled for 5 minutes to obtain a resin composition sheet having a filling rate of filler of 70% by weight. The alpha dose of the sheet of resin composition obtained was measured using a low level alpha dose measuring apparatus LACS-4:000M (manufactured by Sumika Chemical Analysis Service, Ltd.). The sheet was found to have an alpha dose of 0.05 cph/cm$^2$. In the measurement, the coating film was placed on a stainless steel plate (1000 cm$^2$) of the sample measuring section of the apparatus and measured over a period of 99 hours.

Comparative Example 4

(Preparation of Sheet of Resin Composition and Measurement of Alpha Dose Thereof)

A sheet of resin composition was prepared in the same manner as in Example 18 except that barium sulfate obtained in Comparative Example 1 was used in place of barium sulfate obtained in Example 11. The sheet was found to have an alpha dose of 0.33 cph/cm$^2$.

As shown in Examples 17 and 18, the coating film and the sheet of resin composition in which the low alpha dose barium sulfate according to the invention was incorporated exhibit a lower alpha dose than the barium sulfate incorporated in the coating film or the sheet of resin composition.

However, as shown in Comparative Examples 3 and 4, the coating film and the sheet of resin composition in which barium sulfate obtained in Comparative Example 1 and having an alpha dose of 0.47 cph/cm$^2$ were found to have an alpha dose of more than 0.07 cph/cm$^2$.

As shown in Examples, a low alpha dose barium sulfate particle having an alpha dose of 0.07 cph/cm$^2$ or less is obtained by the process of the invention with no necessity of complicated operations for high purity. Such a low alpha dose barium sulfate particle is suitably used for a solder resist layer of a high functional electronic component in which an underfill layer is thinned.

The invention claimed is:

1. A low alpha dose barium sulfate particle having a silica content of 0.6% by weight or less and an alpha dose of 0.07 cph/cm$^2$ or less.

2. A surface treated low alpha dose barium sulfate particle which comprises the low alpha dose barium sulfate particle according to claim 1 surface-treated with at least one selected from silica, silica hydrate and aluminum hydroxide.

3. A resin composition comprising the low alpha dose barium sulfate particle according to claim 1.

4. A coating composition comprising the low alpha dose barium sulfate particle according to claim 1.

5. A resist ink composition comprising the low alpha dose barium sulfate particle according to claim 1.

6. A process for producing a low alpha dose barium sulfate particle comprising:
   a step (1) for subjecting
   (1) a crushed ore having an average particle diameter of 5-50 μm, an alpha dose of 1 cph/cm$^2$ or less, and a silica content of 0.65% by weight or more and 1.6% by weight or less, or
   (2) a crushed ore having an average particle diameter of 5-50 μm, an alpha dose of 1 cph/cm$^2$ or less, and a silica content of 1.6% by weight or more and 2.5% by weight or less, or
   (3) a crushed ore having an average particle diameter of 5-50 μm, an alpha dose of 1 cph/cm$^2$ or less, and a silica content of 2.5% by weight or more,
   wherein the crushed ore is obtained by crushing barite ore, to
   (a) an elutriation treatment, or
   (b) a sieving treatment, or
   (c) an elutriation treatment and a sieving treatment,
   thereby obtaining as a first product:
   a crushed ore having a silica content of 0.65% by weight or less in the case of the crushed ore (1), or
   a crushed ore having a silica content of 1.55% by weight or less in the case of the crushed ore (2), or
   a crushed ore having a silica content of 2.5% by weight or less in the case of the crushed ore (3);
   a step (2) in which the first product is reduced with a reducing agent to generate barium sulfide as a second product, and the barium sulfide is leached into water to obtain an aqueous solution of barium sulfide; and
   a step (3) in which, to the aqueous solution of barium sulfide,
   (a) an aqueous solution of an alkali metal sulfate is added, or
   (b) sulfuric acid is added, or
   (c) hydrochloric acid is added to obtain an aqueous solution of barium chloride; the barium chloride is precipitated; the barium chloride obtained is dissolved in water to obtain an aqueous solution of barium chloride; to the aqueous solution of barium chloride an aqueous solution of an alkali metal sulfate is added to effect the reaction of the aqueous solution of barium chloride with the alkali metal sulfate, or
   (d) hydrochloric acid is added to obtain an aqueous solution of barium chloride, the barium chloride is precipitated, the barium chloride obtained is dissolved in water to obtain an aqueous solution of barium chloride, the aqueous solution of barium chloride is caustified to obtain an aqueous solution of barium hydroxide, and the aqueous solution of barium hydroxide is reacted with sulfuric acid, thereby to generate barium sulfate as a third product, the barium sulfate is precipitated and recovered to obtain a low alpha dose barium sulfate particle having a silica content of 0.6% by weight or less and an alpha dose of 0.07 cph/cm$^2$ or less.

7. The process for producing a low alpha dose barium sulfate particle according to claim 6, wherein the crushed ore is subjected to an acid heating treatment and then to a treatment of the step 1.

8. A process for producing a surface-treated low alpha dose barium sulfate particle having an alpha dose of 0.07 cph/cm$^2$ or less, comprising:

a step (1) for subjecting
- (1) a crushed ore having an average particle diameter of 5-50 μm, an alpha dose of 1 cph/cm$^2$ or less, and a silica content of 0.65% by weight or more and 1.6% by weight or less, or
- (2) a crushed ore having an average particle diameter of 5-50 μm, an alpha dose of 1 cph/cm$^2$ or less, and a silica content of 1.6% by weight or more and 2.5% by weight or less, or
- (3) a crushed ore having an average particle diameter of 5-50 μm, an alpha dose of 1 cph/cm$^2$ or less, and a silica content of 2.5% by weight or more, wherein the crushed ore is obtained by crushing barite ore, to
- (a) an elutriation treatment, or
- (b) a sieving treatment, or
- (c) an elutriation treatment and a sieving treatment, thereby obtaining as a first product:
a crushed ore having a silica content of 0.65% by weight or less in the case of the crushed ore (1),
a crushed ore having a silica content of 1.55% by weight or less in the case of the crushed ore (2), and
a crushed ore having a silica content of 2.5% by weight or less in the case of the crushed ore (3);

a step (2) in which the first product is reduced with a reducing agent to generate barium sulfide as a second product, and the barium sulfide is leached into water to obtain an aqueous solution of barium sulfide; and a step (3) in which, to the aqueous solution of barium sulfide,
- (a) an aqueous solution of an alkali metal sulfate is added, or
- (b) sulfuric acid is added, or
- (c) hydrochloric acid is added to obtain an aqueous solution of barium chloride, the barium chloride is precipitated, the barium chloride obtained is dissolved in water to obtain an aqueous solution of barium chloride, an aqueous solution of an alkali metal sulfate to effect the reaction of the aqueous solution of barium chloride with the alkali metal sulfate, or
- (d) hydrochloric acid is added to obtain an aqueous solution of barium chloride, the barium chloride is precipitated, the barium chloride obtained is dissolved in water to obtain an aqueous solution of barium chloride, the aqueous solution of barium chloride is caustified to obtain an aqueous solution of barium hydroxide, and the aqueous solution of barium hydroxide is reacted with sulfuric acid, thereby to generate barium sulfate as a third product, the barium sulfate is precipitated and recovered to obtain a low alpha dose barium sulfate particle having a silica content of 0.6% by weight or less and an alpha dose of 0.07 cph/cm$^2$ or less; and a step (4) in which the low alpha dose barium sulfate particle is surface-treated with at least one of silica, silica hydrate and aluminum hydroxide.

9. The process for producing a surface-treated low alpha dose barium sulfate particle according to claim 8, wherein the crushed ore is subjected to an acid heating treatment and then to a treatment of the step (1).

\* \* \* \* \*